US006560747B1

(12) United States Patent
Weng

(10) Patent No.: US 6,560,747 B1
(45) Date of Patent: May 6, 2003

(54) ERROR COUNTING MECHANISM

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/437,696

(22) Filed: Nov. 10, 1999

(51) Int. Cl.[7] .......................... G06F 11/00; H03M 13/00
(52) U.S. Cl. ........................................ 714/781; 714/704
(58) Field of Search ............................... 714/781, 782, 714/783, 784, 785, 704, 758, 763, 769, 752, 755, 756, 52, 48, 49, 54; 708/315, 420, 492, 530

(56) References Cited

U.S. PATENT DOCUMENTS

| 5,436,916 A | * | 7/1995 | Nakamura | 714/785 |
| 6,154,869 A | * | 11/2000 | Wolf | 341/94 |
| 6,199,188 B1 | * | 3/2001 | Shen et al. | 714/782 |
| 6,317,858 B1 | * | 11/2001 | Cameron | 714/782 |

OTHER PUBLICATIONS

Richard E. Blahut "A Theory and Practice of Error Control Codes", Addison–Wesley Publishing Company, Reading MA, table of contents, chapter 4 pp. 65–92, chapter 5, pp. 93–129, and chapter 8 pp. 207–247, 1983.
Peterson et al., "A Error–Correcting Codes, Second Edition", MIT Press, Cambridge, MA, London, England, table of contents, chapter 4 pp. 76–115, chapter 6 pp. 144–169, chapter 7 pp. 170–205, and chapter 8 pp. 206–265, 1972.

* cited by examiner

Primary Examiner—Christine T. Tu
(74) Attorney, Agent, or Firm—Daly, Crowley & Mofford, LLP

(57) ABSTRACT

A mechanism for determining a number of errors in an error correction code codeword is presented. The mechanism obtains the degree of an error locator polynomial associated with syndromes generated for the codeword without determining coefficients of the error locator polynomial. The degree is identified as the number of errors. The degree is determined from the syndromes using a Euclidean process which determines the degree without finding the coefficients. Alternatively, the degree is determined by forming a trapezoid-shaped matrix from the syndrome values and finding the rank of that matrix.

23 Claims, 7 Drawing Sheets

ERROR COUNTING MECHANISM

BACKGROUND OF THE INVENTION

The invention relates generally to error correction code decoding mechanisms and more particularly to the decoding of Bose-Chaudhuri-Hocquenghem (BCH) correction codes, including Reed-Solomon error correction codes.

The use of increasingly higher density storage media in digital computer systems has caused an increase in the potential for defect-related data errors. To reduce data loss as a result of such data corruption, error correction codes are employed to correct the erroneous data.

Prior to storing data on a storage device, such as a magnetic disk or tape, it is encoded to form redundancy symbols. The redundancy symbols are appended to the data symbols to form code words, which are then stored on the storage device. When the stored data is retrieved from the storage device for decoding, the redundancy symbols provide information which allows the decoder to recognize errors and, if possible, reconstruct the original code word. A detailed description of decoding may be found in "Error-Correcting Codes," Second Edition, by W. Wesley Peterson and E. J. Weldon, Jr. (MIT Press, 1972), incorporated herein by reference.

One widely-used error correction code is the Reed-Solomon code. Error detection and correction techniques for Reed-Solomon codes are well known.

To correct errors, a decoder must determine the locations and values (or magnitudes) of the detected errors. The decoder first computes error syndromes, which it then uses to generate an error locator polynomial. Once the error locator polynomial has been generated, each error location and value may be determined.

Error locations are determined by solving for the roots of the error locator polynomial $\sigma(x)$ of degree t or less, where t is the number of errors that can be corrected. The solution or roots of the equation $\sigma(x)=0$ correspond to the locations of the errors. These roots are of the form $x=\alpha^i$, where $\alpha$ is the primitive element of the Galois Field $GF(p^q)$ used to encode the data. Once all t roots have been found, the corresponding error values are calculated using the well-known Forney algorithm. The data can then be corrected to produce an error-free data symbol.

Typically, when a codeword is read from the storage media, error correction is performed, as the corrected data is to be provided to a user. There are, however, some instances in which it is useful to determine the number of errors that have occurred in a codeword, but decoding is unnecessary. For example, in a disk test application, codewords are written to and read from a new disk and the number of errors compared to a threshold in order to assess the quality of a new disk. In yet another example, in read-after-write operations of a tape drive, which is typically less reliable than disk, it is desirable to determine the error count immediately after the completion of the read-after-write operation is completed so that the read codeword can be relocated to another storage location on that tape drive if the error count is too high.

There are several prior approaches to determining the number of errors in a codeword retrieved from storage. One approach is to use a conventional decoding algorithm to find the error locator polynomial, the degree of which corresponds to the number of errors. This approach is quite complex, as it requires the full implementation of either of the well-known Berlekamp-Massey or Euclidean algorithms, which are described in "Theory and Practice of Error Control Codes" by Richard E. Blahut (Addison-Wesley, 1983), incorporated herein by reference.

Another prior technique uses a theorem, or more specifically, Theorem 9.9 on page 284 of the above-referenced text by Peterson and Weldon. This theorem states that a v×v matrix M with syndromes as elements is singular (i.e., the determinant is zero) if there are fewer than v errors per code block, and the matrix is nonsingular (i.e., the determinant is nonzero) if there are exactly v errors per code block.

SUMMARY OF THE INVENTION

In one aspect of the invention, determining a number of errors in an error correction codeword includes determining from the error correction codeword a syndrome polynomial which is associated with an error locator polynomial of a degree and having error locator polynomial coefficients, operating on the syndrome polynomial to determine the degree without determining the error locator polynomial coefficients, and identifying the degree as the number of errors in the error correction codeword.

Embodiments of the invention may include one or more of the following features.

It is determined whether or not the number of errors exceeds an error threshold. If the codeword is stored in a storage location on a storage device and if it is determined that the number of errors exceeds an error threshold, the error correction code is rewritten to the storage location, or a different storage location, on the storage device.

In one embodiment, the syndrome polynomial operation includes a Euclidean process that determines the degree without determining the coefficients. For a t error correcting code, the performance of the Euclidean process includes initializing a divisor value as corresponding to the computed syndrome polynomial and a dividend value which corresponds to a polynomial $x^{2t}$. The Euclidean process includes the following: initializing a degree count to zero and a degree count indicator value to zero; producing a quotient value from a leading term of the dividend value and a leading term of the divisor value; generating a remainder value from the quotient value; updating the dividend for the remainder value; incrementing the degree count by one and setting the degree count indicator value to one if the degree count indicator value is set to zero. The steps of producing, generating, incrementing and setting are repeated until the difference of the degree of the divisor value subtracted from the dividend value is less than zero. The process further includes: setting the degree count indicator value to zero; interchanging the divisor value and remainder value; and determining if the degree of the remainder value is less than t. If the degree of the remainder value is less that t, then the process indicates that the degree count is the number of errors. If the degree of the remainder value is not less than. t, then the process repeats the steps of producing, generating, incrementing, setting, repeating, interchanging and determining.

In another embodiment, the syndrome polynomial includes syndrome values and the operation on the syndrome polynomial includes arranging the computed syndrome values to form a matrix having rows of unequal lengths and examining at least one row for nonzero values. The syndrome polynomial operation further includes performing row operations on the rows of the matrix. For a matrix which includes t rows, the syndrome polynomial operation includes indicating that there are fewer than t errors in the codeword if an examined last row t−1 has no nonzero values. Alternately, the step of examining is performed prior to each of the row operations. The steps of examining and performing are repeated until an examined row is equal to all zero values to indicate a number of errors corresponding to the number of the row or the row is row t to indicate that the number of errors is at least t.

In another aspect of the invention, the error number determination is used to test storage devices. Testing the storage device includes reading codewords from the storage device, generating syndrome values for the codewords, determining from the syndrome values for each of the codewords a degree of an error locator polynomial without computing the coefficients of the error locator polynomial, the degree corresponding to a number of errors. The number of errors is then compared to an error threshold. The storage device is rejected if the number of errors of a predetermined number of one or more of the read codewords exceeds threshold.

Among the advantages of the present invention are the following. The error count can be determined without computing the error locator polynomial. Therefore, the error count for a codeword is realized with a much smaller number of operations than are required by either of the Berlekamp-Massey or Euclidean algorithms. This is quite useful for applications that need to quickly establish the condition of the codeword. Because only the degree is determined, a Euclidean approach is advantageously modified to eliminate error locator polynomial computation steps, e.g., coefficient multiplications and error locator polynomial updates, which consume memory and computation cycles. Only the degree of the error locator polynomial need be updated and retained. The actual error locator polynomial, which can be obtained from all of the quotient values, need not ever be computed, and the quotient values may be discarded once the degrees of the quotients are used to update the degree of the error locator polynomial.

Additionally, the Euclidean computation polynomials have the property that degree of the remainder value (remainder polynomial) is less than the degree of the divisor value (divisor polynomial), the degree of each quotient value is at least one and, consequently, the degree of the error locator polynomial is always increasing during the iterative Euclidean process. Therefore, if after t iterations the degree of the error locator polynomial is at least t and the degree of the remainder polynomial is still not lower than t, there is no need to proceed further, since the error locator polynomial degree will exceed t for any additional computations.

The matrix evaluation makes the above-mentioned textbook theorem readily applicable to error counting by providing a condition for the case of more than v errors. The evaluation need not examine matrices of different sizes to provide an accurate error count.

Other features and advantages of the invention will be apparent from the following detailed description and from the claims.

DETAILED DESCRIPTION

The present invention features a mechanism which determines the number of errors that have occurred in a codeword. The determination finds the degree of an error locator polynomial associated with the codeword's syndrome polynomial without determining the error locator polynomial coefficients. The degree of the error locator polynomial is identified as the number of errors. In one embodiment, the degree is determined by a Euclidean process that is a modification of the conventional Euclidean algorithm. In another embodiment, the degree is determined by a rank evaluation of a specially shaped "matrix" of syndrome values. Both of these embodiments will now be described.

Figure 1:
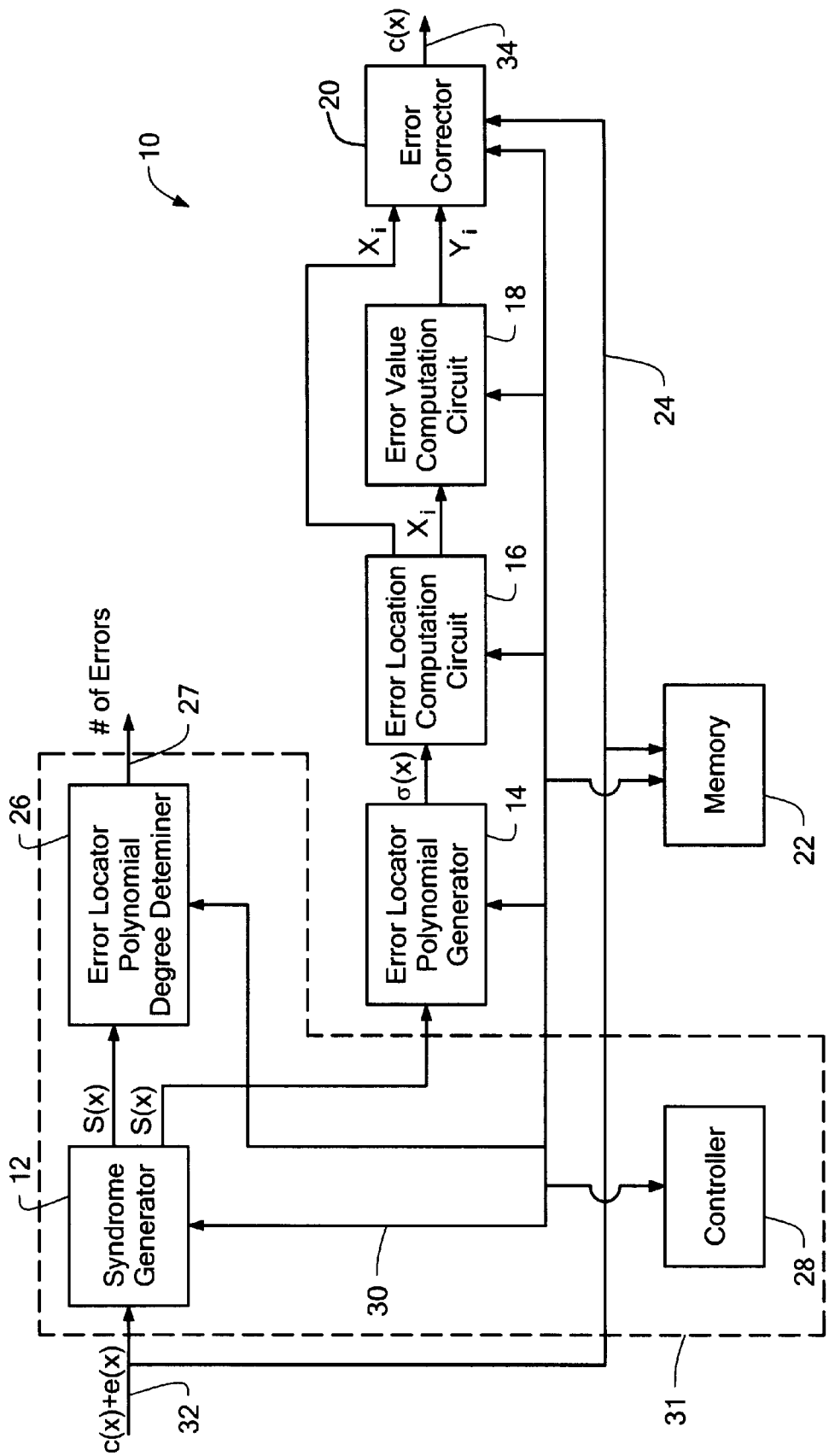
FIG. 1 is an block diagram of a Reed Solomon decoder having an error locator polynomial degree determiner as well as a conventional error locator polynomial generator.

Referring to FIG. 1, a Reed-Solomon code decoder 10 is shown. The Reed Solomon decoder 10 includes an arrangement of functional units, including a syndrome generator 12, an error locator polynomial generator 14, an error location computation (or root finding) circuit 16, an error value computation unit 18 and an error corrector 20. Also included is a memory 22 for storing a copy of a received codeword received on a data bus 24. The memory 22 stores the received codeword while the locations and values of detected errors of the received codeword are being computed by units 12, 14, 16 and 18, collectively. The units 12, 14, 16, 18 and 20 are conventional decoder blocks, the details of which are largely omitted herein. The decoder 10 also includes an error locator polynomial determiner 26 for producing an error number output value 27, which will be described in detail below. Control of each of these functional units is effected by a controller 28. Control signals are provided to the functional units by the controller 28 over a control bus 30. The syndrome generator 12, the error locator polynomial determiner 26 and the controller 28 are referred to collectively as an error count unit 31.

The decoder 10 receives as an input a codeword c(x), which may contain some error e(x). Therefore, the received codeword, i.e., c(x)+e(x), is referred to as c'(x). The codeword c(x) of n symbols includes k information or data symbols d(x) and r (i.e., "n−k") redundancy symbols r(x). Each of the symbols is m bits in length. The redundancy symbols are derived by dividing the information symbols by a generator polynomial g(x). Division results in a quotient q(x), which is ignored, and a remainder r(x). The remainder includes the redundancy symbols which are then added to the n-k lowest order locations of c(x). With Reed-Solomon codes, the number of redundancy symbols r to correct an error must be at least twice the number of errors t that are to be corrected; thus, there must be r≧2t redundancy symbols in a t-error-correcting code. As the order of the remainder corresponds to the order of the divisor, the generator polynomial implemented for a t error correcting Reed-Solomon code having n≦$2^m$−1, m-bit symbols is as follows:

$$g(x)=(x-\alpha^L)(x-\alpha^{L+1}) \ldots (x-\alpha^{L+r-1}) \qquad \text{Eq. (1)}$$

where $\alpha^i$ for $I=L, L+1, \ldots L+r-1$, is a field element of $GF(2^m)$ and L is a constant of the Galois field factor $(x-\alpha^i)$. The codeword $c(x)$ is a multiple of both the generator polynomial and each of its factors or roots. Thus, the division of the received word $c'(x)$ by the generator polynomial $g(x)$ or each of its roots, if the received worked contains no errors, results in some quotient and a remainder of zero.

Still referring to FIG. 1, the codeword $c'(x)$ is applied to the syndrome generator 12 over an input bus 32 from a storage device (not shown). For error correction purposes, it is necessary to generate a number of syndromes equal to twice the number of errors being corrected, i.e., 2t. The syndrome is defined as the remainder after dividing the received word $c'(x)$ by a root $(x-\alpha^i)$ of the generator polynomial $g(x)$. This is the equivalent of evaluating the received polynomial $c'(x)$ at $\alpha^i$, i.e., $c'(\alpha^i)$. As there are t such roots, there are 2t syndromes. The syndromes are mathematically related to error locations and error values by the relationship:

$$S_j = \sum_{c}^{t-1} Y_i X_i^j \qquad \text{Eq. (2)}$$

where $X_i$ are the error locations and the $Y_i$ are the error values, and $S_j = c'(\alpha^j)$. $X_i$ is an element of the Galois field and the power of $\alpha$ corresponds to the location of the symbol error, i.e., if $X_i = \alpha^{83}$, the 83rd symbol is in error. The value of $Y_i$ is also an element of Galois Field $GF(2^m)$ and corresponds to the error pattern.

Therefore, the received code word $c'(x)$ is tested for the presence of errors by computing syndromes $S_j = c'(\alpha^i)$, where $j=L, L+1, \ldots, L+r-1$. If all syndromes $S_j$ are zero, then there is no error and therefore no need for further decoding. If at least one $S_j$ is nonzero, the codeword $c'(x)$ must be subject to further processing by the decoder 10.

During a decoding process, the controller 28 directs the syndrome generator 12 to provide the computed syndromes to the error locator polynomial generator 14, which calculates the coefficients of an error locator polynomial from the computed syndromes according to known algorithms, such as the Berlekamp-Massey or Euclidean algorithms. The error locator polynomial is of the form:

$$\sigma(x)=\sigma_t x^t + \sigma_{t-1}x^{t-1}+\sigma_{t-2}x^{t-2}+\sigma_{t-3}x^{t-3}+\sigma_2 x^2+\sigma_1 x+\sigma_0 \qquad \text{Eq. (3)}$$

for a t-error correcting code.

For a minimum distance D code having $t \leq D/2$, the mathematical relationship between $S(x)$ and $\sigma(x)$ is well-defined by known equations that enable $\sigma(x)$ to be found for a given $S(x)$. Therefore, it can be said the syndrome polynomial generated for a codeword is associated with or implies the particular error locator polynomial from which the locations of the errors in the codeword may be obtained.

The coefficients of the error locator polynomial $\sigma(x)$ generated by the error locator polynomial generator 14 are transferred to the error location computation circuit 16. The error location computation circuit 16 evaluates $\sigma(x)$ for each power of $\alpha^j$, $j=0, 1, 2, 3, \ldots, n-1$ (n being the total number of symbols in the codeword $c'(x)$) and determines if the result is zero or non-zero. The values of $\sigma(x)$ equal to zero correspond to error locations $X_i$, which are provided to the error values computation unit 18 and the error corrector 20, as shown. A detailed example of the error locator polynomial generator 14 is described below with reference to FIG. 2.

Still referring to FIG. 1, the error values computation unit 18 receives as inputs the error locations $X_i$ and the syndromes $S_i$ and computes error values $Y_i$ using known techniques, such as the well-known Forney algorithm.

The error corrector 20 receives the codeword $c'(x)$ from the memory 22, along with each error location $X_i$ and error value $Y_i$ from the error location computation circuit 16 and the error values computation unit 18, respectively. It adds the error value $Y_i$ to the corresponding erroneous symbol read from the error location $X_i$ to produce on an output bus 34 an error-free symbol of codeword $c(x)$.

All of the information needed to find errors and error values can be obtained from the syndrome values computed for Reed-Solomon and BCH codes. The D-1 syndrome values $S[L], S[L+1], \ldots, S[L+D-2]$ are assumed known for a minimum distance D code. This is the starting point of a full decoding process. The first step in the decoding process is to find the so-called error-locator polynomial $\sigma(x)$ from the syndrome values, typically by applying a conventional Berlekamp-Massey algorithm or Euclidean algorithm.

Hereinafter, a conventional method of calculating the error locator polynomial according to the Euclidean algorithm will be briefly described. The Euclidean algorithm is a recursive algorithm by which a common divisor $v(x)$ of two polynomials $a(x)$ and $b(x)$ is obtained and for producing an equation $$s(x)a(x)+t(x)b(x)=v(x) \qquad \text{Eq. [4]}$$

that expresses $v(x)$ as a linear combination of $a(x)$ and $b(x)$. The equation may be rewritten as $$t(x)b(x)=v(x) \; [\bmod \; a(x)] \qquad \text{Eq. [5]}$$

The Euclidean algorithm solves the equation for $t(x)$ and $v(x)$ given the known $a(x)$ and $b(x)$ with a repetition of divisions of polynomials defined over a Galois field, and can be expressed as follows. That is, in the Euclidean algorithm, divisions of the two polynomials $a(x)$ and $b(x)$, $a(x)/b(x)=q_0(x)$ (quotient) $\ldots r_o(x)$ (remainder)

$b(x)/r_o(x)=q_1(x)$ (quotient) $\ldots r_1(x)$ (remainder)

$r_o(x)/r_1(x)=q_2(x)$ (quotient) $\ldots r_2(x)$ (remainder)

are repeated until predetermined conditions are satisfied. In application to BCH and RS codewords, the two polynomials are defined as $a(x)=x^{2t}$ and $b(x)=S(x)$, the syndrome polynomial. The term $t(x)$ is defined as $\sigma(x)$. The divisions are repeated until the degree of the remainder polynomial $r(x)$ is reduced to less than t.

Figure 2:
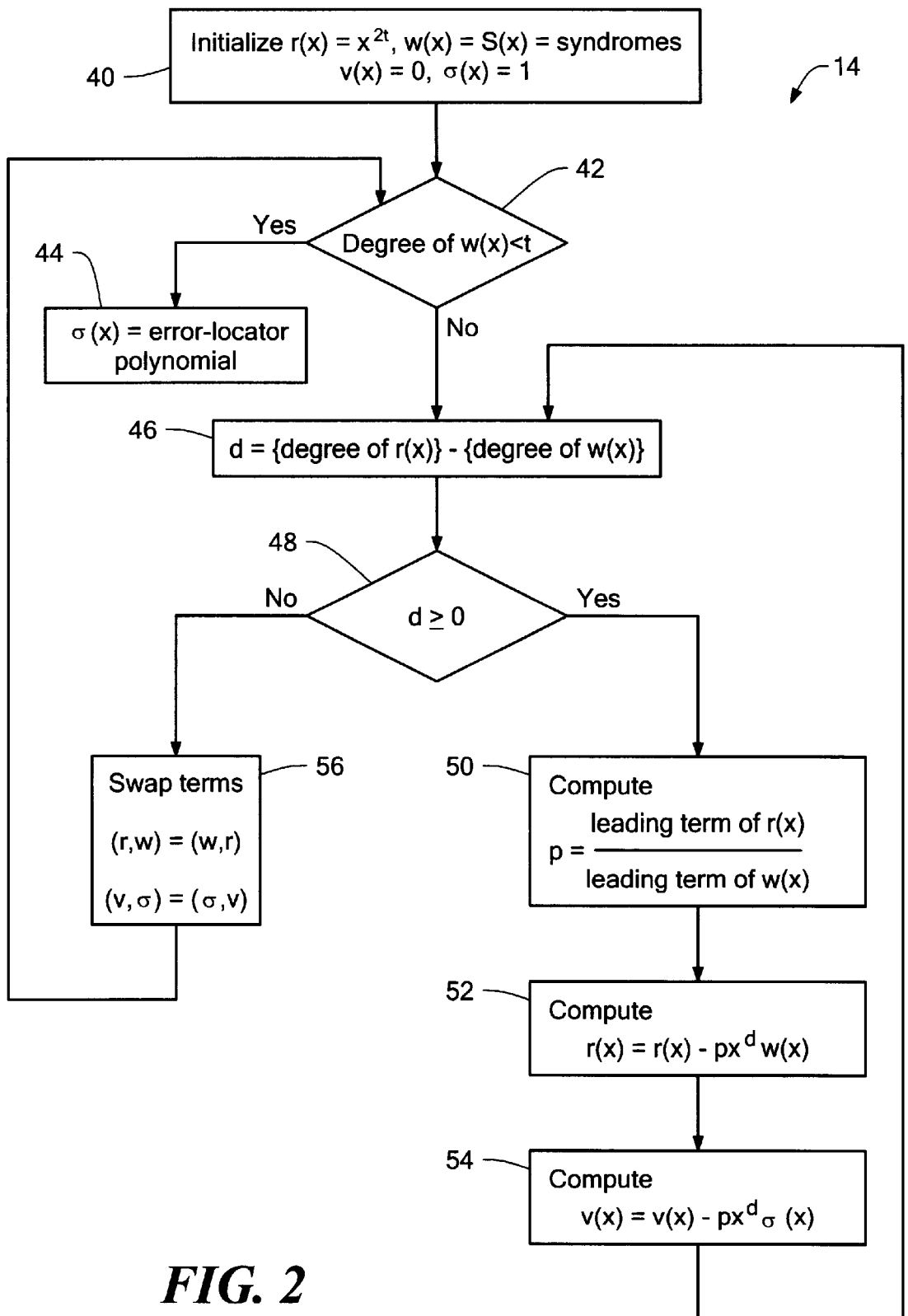
FIG. 2 is a flow diagram of a method of generating the error locator polynomial (as performed by the error locator polynomial generator of FIG. 1) by applying a conventional Euclidean algorithm.

Referring to FIG. 2, a process of obtaining a solution (error locator polynomial $\sigma(x)$) 14 according to a conventional Euclidean algorithm is shown. Initially, in step 40, the process initializes a dividend value $r(x)=x^{2t}$, a divisor value $w(x)=S(x)=$syndrome values, $v(x)=0$ and $\sigma(x)=1$. The process determines if the degree of $w(x)<t$ (step 42). If it is, the process is complete, that is, $\sigma(x)$ is the error locator polynomial (step 44). If instead, at step 42, the degree of $w(x)$ is found to be greater than t, then a quotient degree value d is computed as {degree of $r(x)$}−{degree of $w(x)$} (step 46). If d is greater than or equal to 0 (step 48), the process produces a quotient value p by dividing the leading term of $r(x)$ by the leading term of $w(x)$ (step 50). The process then computes $r(x)$ as $r(x)-px^d w(x)$ (step 52) and $v(x)$ as $v(x)-px^d \sigma(x)$ (step 54), and returns to step 46. If d is less than zero at step 48, the process interchanges $r(x)$ with $w(x)$ and $v(x)$ with $\sigma(x)$ (step 56), and returns to step 42.

Assume, for example, an ECC codeword with the capability to correct t=3 errors, $x^{2t}=x^6$, and syndrome polynomial $S(x)=\alpha^7 x^5+\alpha^0 x^4+\alpha^{13} x^3+\alpha^{11} x^2+\alpha^{14} x+\alpha^7$. Thus, referring back to FIG. 2, step 42, the degree of r(x) is equal to 6, which is not less than t=3. At step 46, d={degree of r(x)}-{degree of w(x)}=6-5=1. As d is greater than zero (step 48), the process computes p by dividing the leading term of r(x) by the leading term of w(x) as follows:

$$\alpha^7\alpha^0\alpha^{13}\alpha^{14}\alpha^{11}\alpha^7 \quad \begin{array}{c} \alpha^8 \\ \hline |\alpha^{00}\ 0\ 0\ 0\ 0 \\ \alpha^0\alpha^8\alpha^5\alpha^4\alpha^7\alpha^0 \\ \hline \alpha^8\alpha^5\alpha^4\alpha^7\alpha^0 \end{array} \quad \mathrm{Deg}\,r(x)=4$$

At step 50, $p=\alpha^8$ and r(x) thus becomes remainder $\alpha^0 x^6 - \alpha^8 x*w(x)=\alpha^8 x^5+\alpha^5 x^4+\alpha^4 x^3+\alpha^7 x^2+\alpha^0 x$ at step 52 and $v(x)= 0-(\alpha^8 x*1)=-\alpha^8 x$ at step 54. Returning to step 46, d=5-5=0, so the division step 50 is again performed, as shown below.

$$\alpha^7\alpha^0\alpha^{13}\alpha^{11}\alpha^{14}\alpha^7 \quad \begin{array}{c} \alpha^8\alpha^1 \\ \hline |\alpha^{00}\ 0\ 0\ 0\ 0\ 0 \\ \alpha^0\alpha^8\alpha^5\alpha^4\alpha^7\alpha^0 \\ \hline \alpha^8\alpha^5\alpha^4\alpha^7\alpha^0 \\ -\alpha^8\alpha^1\alpha^{14}\alpha^{12}\alpha^0\alpha^8 \\ \hline \alpha^{11}\alpha^9\alpha^{20}\,\alpha^8 \end{array} \quad \begin{array}{c}\mathrm{Deg}\,r(x)=4\\ \\ \mathrm{Deg}\,r(x)=4\end{array}$$

As shown above, $p=\alpha^1$ and $r(x)=\alpha^{11} x^4+\alpha^9 x^3+\alpha^2 x^2+\alpha^0 x+\alpha^8$. The value of $v(x)=-\alpha^8 x-(\alpha^1*1)=-\alpha^8 x-\alpha^1$. Returning again to step 46, d=4-5=-1. Because d<0 (step 48), the process swaps r(x) with w(x), as well as v(x) and a(x), at step 56 and returns to step 42. Since the degree of w(x)=4 is not less than t (=3), the process performs another iteration of the computation of p, r(x) and v(x). The computation of p and r(x) is as follows:

$$\alpha^{11}\alpha^9\alpha^2\,0\,\alpha^8 \quad \begin{array}{c} \alpha^{11}\alpha^{14} \\ \hline |\alpha^7\alpha^0\alpha^{13}\alpha^{11}\alpha^{14}\alpha^7 \\ \alpha^7\alpha^{15}\alpha^{13}0\,\alpha^4 \\ \hline \alpha^{10}\alpha^0\alpha^{11}\alpha^9\alpha^7 \\ -\alpha^{10}\alpha^8\alpha^1 0\,\alpha^7 \\ \hline \alpha^8\alpha^6\alpha^9 0 \end{array} \quad \begin{array}{c}\mathrm{Deg}\,r(x)=4\\ \\ \mathrm{Deg}\,r(x)=3\end{array}$$

The updated value of $v(x)=1-(\alpha^{11}x)*(-\alpha^8 x-\alpha^1)=\alpha^4 x^2+\alpha^2 x+0$. Since d=3-4=-1, the process swaps r(x) and w(x), as well as v(x) and σ(x).

$$\alpha^8\alpha^6\alpha^9 0 \quad \begin{array}{c} \alpha^3 \\ \hline |\alpha^{11}\alpha^9\alpha^{20}\,\alpha^8 \\ \alpha^{11}\,\alpha^9\,\alpha^{12}\,0 \\ \hline 0\,\alpha^{70}\alpha^8 \end{array} \quad \mathrm{Deg}\,r(x)=2$$

The value of $\sigma(x)=\sigma_2(x)*\alpha^3 x+\sigma_1(x)=\alpha^7 x^3+\alpha^5 x^2+\alpha^8 x+\alpha^1$. As the degree of w(x) is now less than t (at step 42), the process is complete and the current value of σ(x) is the error locator polynomial.

It is understood that the degree of σ(x) corresponds to the number of errors. However, using the full Euclidean algorithm, and as can be seen from the example above, the degree is not known until the error locator polynomial itself has been calculated.

Unlike the conventional algorithm, the error locator polynomial degree determiner 26 (of FIG. 1) can accurately determine the number of errors in a codeword without determining the error-locator polynomial. As will appreciated from the description to follow, a modified algorithm performed by the determiner 26 saves time and storage space. That is, it does not need to carry out the coefficient update multiplications and does not need to save (i.e., store) and update the quotient values for the duration of the process. The quotient values may be discarded as soon as the quotient degrees are used to update the error locator polynomial degree, as they will not be needed to compute the error locator polynomial. Moreover, the dividend value can also be discarded as soon as the remainder value is computed.

Figure 3:
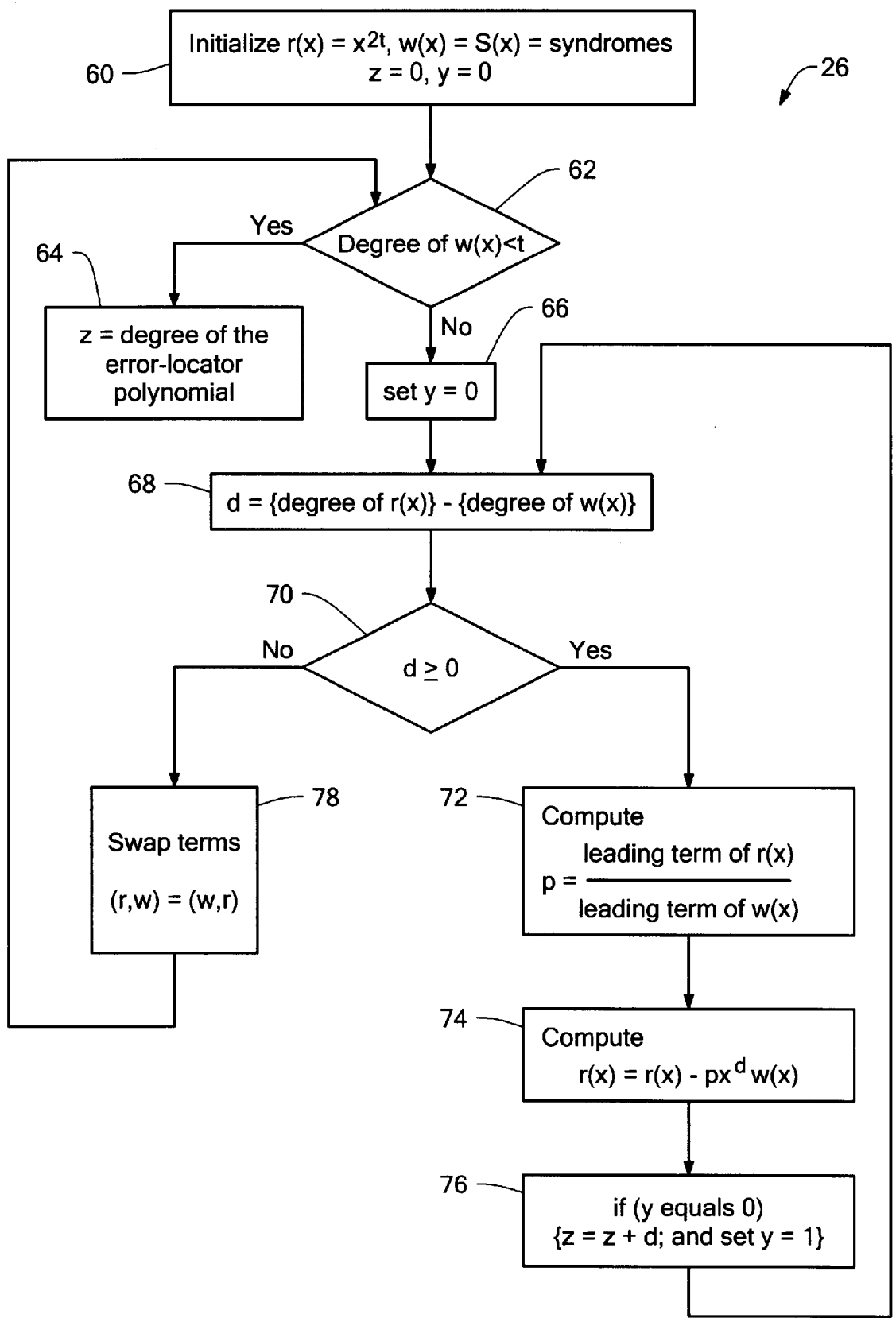
FIG. 3 is a flow diagram of a method of determining a number of errors in a codeword using a Euclidean process.

Referring to FIG. 3, a Euclidean process of the error locator polynomial degree determiner 26 (of FIG. 1) that finds the error locator polynomial degree corresponding to the number of errors without computing the error locator polynomial coefficients is shown. The Euclidean process initializes $r(x)=x^{2t}$, a divisor w(x)=S(x)=syndrome values and an error locator polynomial degree value z=0 (step 60). The process determines if the degree of w(x)<t (step 62). If it is, the process is complete, indicating the degree z as the degree of the error locator polynomial (step 64). If instead, at step 62, the degree of w(x) is found to be greater than or equal to t, then a degree count indicator value y is set to 0 (step 66) and a quotient degree value d equal to the difference {degree of r(x))}-{degree of w(x)} is obtained (step 68). If d is greater than or equal to 0 (step 70), the process produces a quotient value p from the leading term of the dividend value r(x) and the leading term of divisor value w(x) by dividing the leading term of the dividend value r(x) by the leading term of divisor value w(x)(step 72). The process then generates r(x) from $r(x)-px^d w(x)$ (step 74). If the process determines that y is equal to 0, then z becomes equal to z+d and y is set to 1 (step 76). The process then returns to step 68. If d is less than zero at step 70, then the process interchanges term r(x) with w(x) (step 78) and returns to step 62.

Other embodiments of the error locator polynomial degree determiner 26 of FIG. 1 are contemplated. For example, in one alternative embodiment of the error locator polynomial degree determiner 26, the number of errors is determined by evaluating a matrix (obtained from the syndromes). In this second approach, the computed syndromes S[L], S[L+1], . . . , S[L+D-2] are arranged to form the following specially shaped (trapezoid-shaped) "matrix":

row 0 S[L], S[L+1], S[L+2], S[L+3], . . . , S[L+D-4], S[L+D-3], S[L+D-2]

row 1 S[L+1], S[L+2], S[L+3], S[L+4], . . . , S[L+D-3], S[L+D-2]

row 2 S[L+2], S[L+3], S[L+4], S[L+5], . . . , S[L+D-2] . . .

row (t-1) S[L+t-1], S[L+t], S[L+t+1], . . . , S[L+D-2]   Matrix 1

In Matrix 1 above, t≤D/2 is the maximum number of errors to be determined. If, for example, t=5, D=10 and L=2, then Matrix 1 becomes

S[2], S[3], S[4], S[5], S[6], S[7], S[8], S[9], S[10]

S[3], S[4], S[5], S[6], S[7], S[8], S[9], S[10]

S[4], S[5], S[6], S[7], S[8], S[9], S[10]

S[5], S[6], S[7], S[8], S[9], S[10]

S[6], S[7], S[8], S[9], S[10]   Matrix 2

For a t-row matrix, the number of errors that can be determined includes 0, 1, 2, . . . , t−1, as well as ≧t. The operations are row operations, which differ from row operations performed on a regular matrix (see, for example, pp. 32–37 of the Peterson and Weldon book referenced above) only insomuch that the rows of Matrix 2 are of different lengths. A row operation thus involves two rows of different lengths r[j] and r[k]. If r[j] is assumed greater than r[k] for j greater than k, the operation involves r[k] elements. Furthermore, the row with length r[j] is modified and XORed to the row with length r[k]. Given that there are t rows, row 0, row 1, . . . , row (t−1) with respective lengths D−1, D−2, . . . , D−t, the row reduction can be performed systematically.

Figure 4:
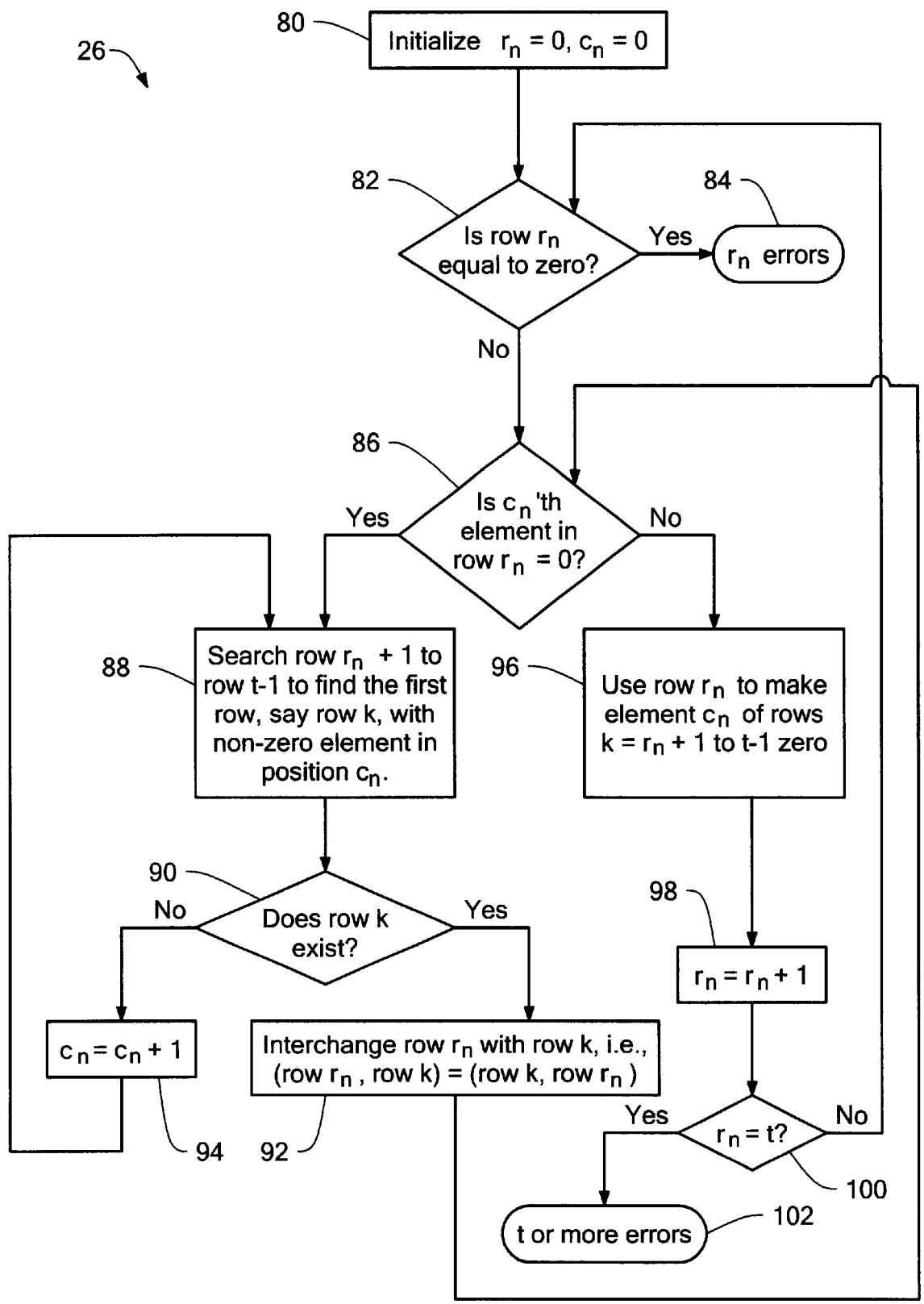
FIG. 4 is a flow diagram of an alterative method of determining the number of errors using a syndrome "matrix" evaluation.

Referring to FIG. 4, the matrix rank finding operation (or process) initializes a row number $r_n=0$ and an element number $c_n=0$ (step 80). The process first determines if row $r_n$ contains all zero values (step 82). If so, the process produces error number information indicating that there are $r_n$ errors (step 84). If row $r_n$ does not contain all zero values at step 82, then the process determines if the $c_n$'th element in row $r_n$ is equal to zero (step 86). If this element is zero, the process searches row $r_n+1$ to row t−1 to find a (preferably first) row with a nonzero element in position $c_n$ (step 88). This first row is "row k". If such a row k exists (step 90), the process interchanges row $r_n$ with row k (i.e., (row $r_n$, row k)=(row k, row $r_n$) (step 92) and returns to step 86. If row k does not exist, then the process increments $c_n$ by 1 (step 94) and returns to step 88. If, at step 86, it is determined that the $c_n$'th element is nonzero, then the process uses row $r_n$ to make the element $c_n$ of rows k=$r_n$+1 to t−1 equal to zero (step 96) The process increments the value of $r_n$ by 1 (i.e., $r_n$ becomes $r_n$+1) (step 98), and determines if $r_n$ is equal to t (step 100). If $r_n$ is equal to t, then the process produces error number information indicating that there are t or more errors (step 102). If $r_n$ is not equal to t, then the process returns to step 82.

Figure 5:
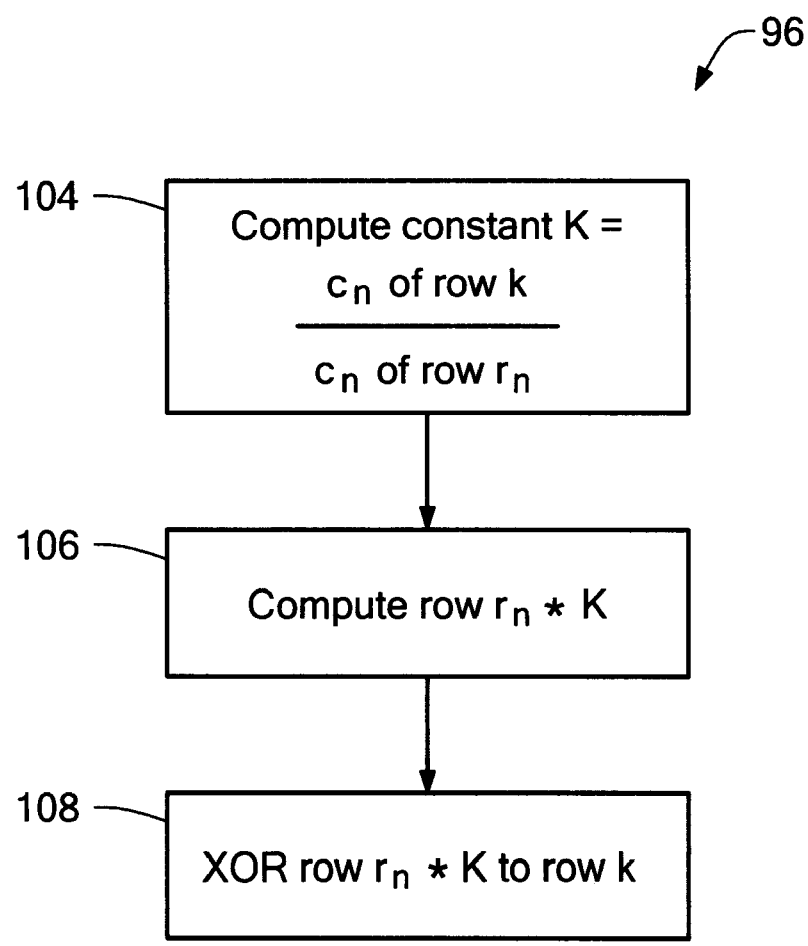
FIG. 5 is a flow diagram of a row operation of the syndrome matrix evaluation method of FIG. 4.

Referring to FIG. 5, the row operation 96 of FIG. 4 is shown in further detail. The process computes a constant K equal to ($c_n$ of row k) divided by ($c_n$ of row $r_n$) (step 104) and then multiplies row $r_n$ times K (step 106). Once K*(row $r_n$) has been computed, the process XORs K*(row $r_n$) to row k (step 108). An example illustrating these row operation steps is provided below.

EXAMPLE

Here, mod 11 arithmetic is used (results are reduced by a multiple of 11) to make the final answer a value in the set of {0,1,2,3,4,5,6,7,8,9,10}, and values of rows $r_n$ and k are row $r_n$=0 0 7 4 9 8 1 6 5 and row k=0 0 5 4 3.

Step 104:

K=5/7=5*(1/7)=5*([55+1]/7)=5*8=40=7 mod 11.

Step 106:

K*(row $r_n$)=7*(row $r_n$)=0 0 5 6 8 1 7 9 2

Step 108:

XOR of K*(row $r_n$) to row k=[7*(row $r_n$)]−row k=0 0 0 2 5. The result of the row operation 96 (of FIGS. 4 and 5), illustrated in the above example, is that the $c_n$'th element is zero for row $r_n$+1, $r_n$+2, . . . , $r_n$+t−1. In other words, only row $r_n$ has a non-zero element at position $c_n$.

It will be appreciated that the operations of FIG. 5 are similar to those for finding the rank of a regular t*(D−1) matrix except that the rows are of unequal lengths. It will be further appreciated that other efficient rank finding algorithms can be modified (to take care of the unequal row lengths) to obtain the rank of the matrix.

For example, if Matrix 2 is reduced to

| S[2], | S[3], | S[4], | S[5], | S[6], | S[7], | S[8], | S[9], | S[10] | Matrix 3 |
|---|---|---|---|---|---|---|---|---|---|
| 0, | X[4], | X[5], | X[6], | X[7], | X[8], | X[9], | X[10] | | |
| 0, | 0, | 0, | 0, | 0, | 0, | 0, | 0 | | |
| 0, | 0, | 0, | 0, | 0, | 0, | 0 | | | |
| 0, | 0, | 0, | 0, | 0, | 0 | | | | | and it is assumed that x[j]'s are not all zeros, the rank of Matrix 3 is two. This rank implies that there are exactly two errors. If Matrix 2 is reduced to

| S[2], | S[3], | S[4], | S[5], | S[6], | S[7], | S[8], | S[9], | S[10] | Matrix 4 |
|---|---|---|---|---|---|---|---|---|---|
| 0, | X[4], | X[5], | X[6], | X[7], | X[8], | X[9], | X[10] | | |
| 0, | 0, | Y[6], | Y[7], | Y[8], | Y[9], | Y[10] | | | |
| 0, | 0, | 0, | 0, | 0, | 0 | | | | |
| 0, | 0, | 0, | 0, | 0 | | | | | | with X[j]'s not all zero and Y[k]'s not all zeros, the rank is three, thus implying a rank of 3.

If it is desirable to produce error number information that indicates whether or not the number of errors is below a given threshold h, where h is less than or equal to t, the process needs to use an h row matrix. After the row reductions have been completed, only a last row, row h−1, needs to be examined: if it is an all zero row, then there are fewer than h errors; otherwise, there are h or more errors. This type of threshold detection is particularly useful for a threshold of h=t, as t is the maximum number of errors which can be corrected. Thus, for a threshold of h=t, for example, the process 26 shown in FIG. 4 can be modified for this threshold detection by determining if $r_n$ is equal to t−1 at step 100, returning to step 86 for further row reduction operations if $r_n$ is not equal to t−1 and returning to step 82 to examine the row as a potential all zero row if $r_n$ is equal to t−1. If the row has all zero values, the process indicates less than t errors (instead of $r_n$ errors) at step 84. If the row has nonzero values, the process indicates t or more errors (i.e., step 102).

That the number of errors may be determined accurately using the above-described matrix method is supporting by the following. It is well-known that the number of errors of an error pattern, t, corresponds to the degree of the error locator polynomial and that for t<D/2, the error locator polynomial σ(x) is unique. Furthermore, if σ(t)*S[L+j]+σ(t−1)*S[L+j+1]+σ(t−2)*S[L+j+2]+ . . . +σ(2)*S[L+j+t−2]+σ(1)*S[L+j+t−1]+σ(0)*S[L+j+t]=0 for j=0, 1, 2, . . . , D−1−t, then it follows that $$[\sigma(t)\ \sigma(t-1)\ \ldots\ \sigma(1)\ \sigma(0)]\begin{bmatrix} S[L+j] & S[L+j+1] & \ldots & S[L+j+t] \\ S[L+j+1] & S[L+j+2] & \ldots & S[L+j+t+1] \\ \ldots & \ldots & \ldots & \\ S[L+j+t] & S[L+j+t+1] & \ldots & S[L+j+2t] \end{bmatrix} = 0.$$

Eq. [6]

The matrix of Eq. [4] is a sub-matrix of Matrix 1. The rank of the matrix of Eq. [4] is t. Therefore, the row operations of Matrix 1 result in t non-zero rows. One way to ensure that the error locator polynomial is of degree t is to perform rank computation on every possible sub-matrix of Matrix 1 of (t+1)*(t+1) to determine that each of the ranks is indeed t. This rank computation, which is time-consuming, is equivalent to the more efficient matrix evaluation process 26 of FIG. 4 as earlier presented.

Figure 6:
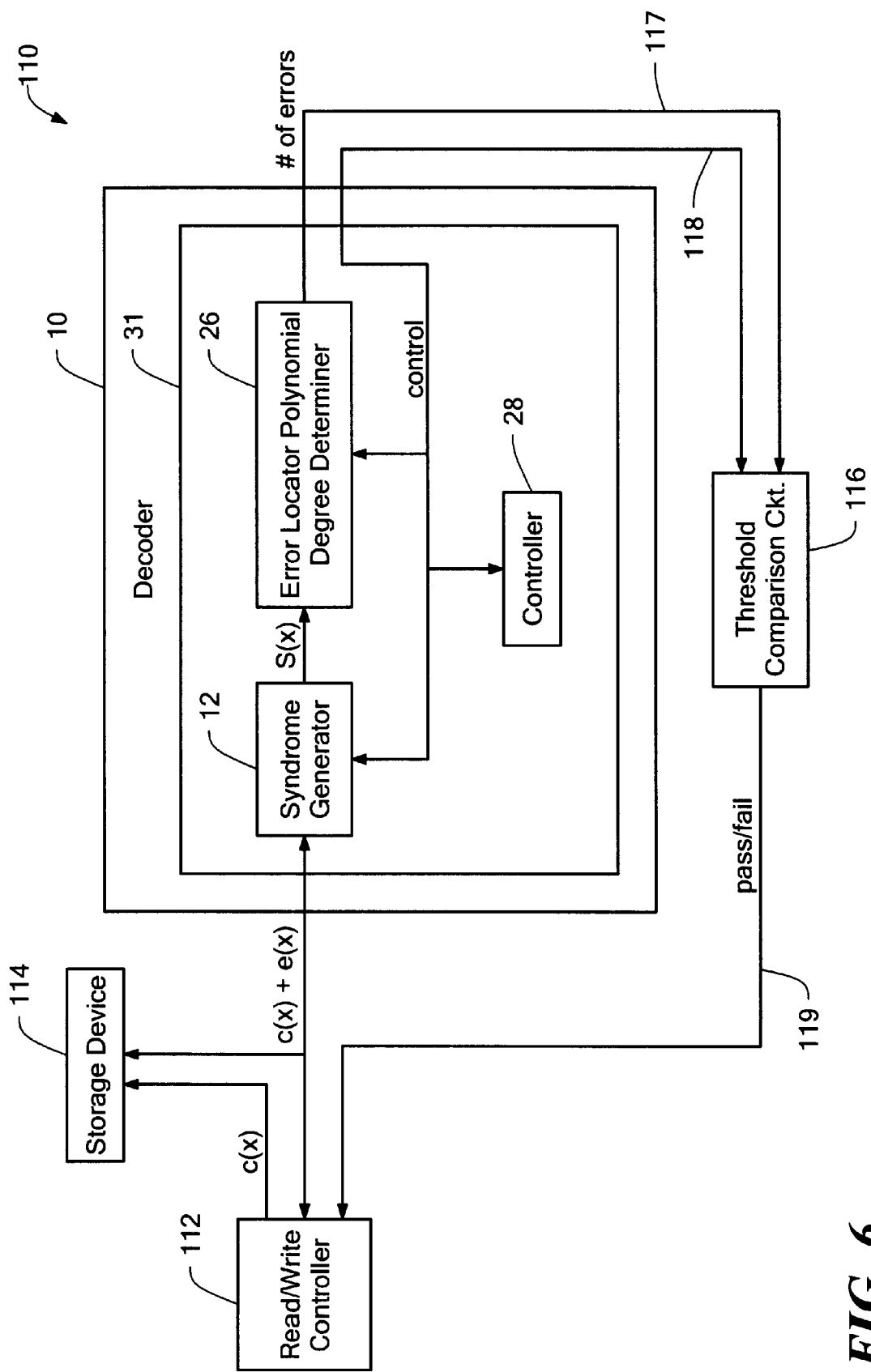
FIG. 6 is a block diagram of a data storage system which employs the error locator polynomial degree determiner of FIGS. 1, 3 and 4.

Referring to FIG. 6, a data storage system 110 for employing the determiner 26 (from FIG. 1) to generate an error number is shown. The data storage system 110 includes a read/write controller 112 for reading codewords from and writing codewords to a storage device 114, which includes a storage medium such as a magnetic tape. In addition to the read/write controller 112 and the storage device 114, the data storage system 110 includes the decoder 10 (from FIG. 1) and a threshold comparison circuit 116. Although depicted as a circuit, the threshold comparison may be implemented in software as a threshold comparison unit 116. The threshold comparison circuit (or unit) 116 generates a pass/fail signal to the read/write controller 112 in response to the number of errors received from the decoder 10 and a predetermined error threshold supplied by the controller 28. Alternatively, the predetermined error threshold may be stored in the threshold comparison circuit. Although the decoder 10 is identical to the decoder 10 of FIG. 1, only the error count unit 31 (with its internal functional units, the syndrome generator 12, the error locator polynomial degree determiner 26 and the controller 28) is shown for purposes of simplification.

Still referring to FIG. 6, the read/write controller reads a codeword from a storage location on the storage device 114 and transfers the codeword to the syndrome generator 12 of the error count unit 31. The syndrome generator 12 process the codeword to produce a syndrome polynomial S(x), which is associated with an error locator polynomial. The error locator polynomial determiner 26 then determines from the syndrome polynomial the degree of the error locator polynomial without computing the error locator polynomial coefficients, preferably using one of the techniques described with reference to FIGS. 3 and 4. The determiner 26 identifies as an output value 117 the degree as the number of errors in the codeword and sends the error number output value, along with appropriate control signals 118 (which include the predetermined error threshold) from the controller 28 to the threshold comparison circuit 116. In response to these inputs, the threshold comparison circuit 116 compares the number of errors to the predetermined error threshold and provides to the read/write controller 112 a "fail" indication 119 if the threshold comparison circuit 116 determines that the number exceeds the predetermined error threshold. The read/write controller can then take appropriate action based on this failure indication. For instance, if the storage medium is magnetic tape, which is inherently less reliable than, say, magnetic disk, the read/write controller can immediately re-write the codeword c(x) to the storage location from which the codeword was read, or to a different storage location on the tape.

It will be appreciated that the computational process of determiner 26 may be implemented in hardware, or in software executing on a processing unit (such as a microprocessor). It will be further appreciated that the error count unit 31 of the present invention need not reside in a decoder as shown in FIG. 1. It may be employed in hardware and/or software which does not routinely perform error decoding/correction operations. Such an application is a storage device test unit, an example of which is shown in FIG. 7.

Figure 7:
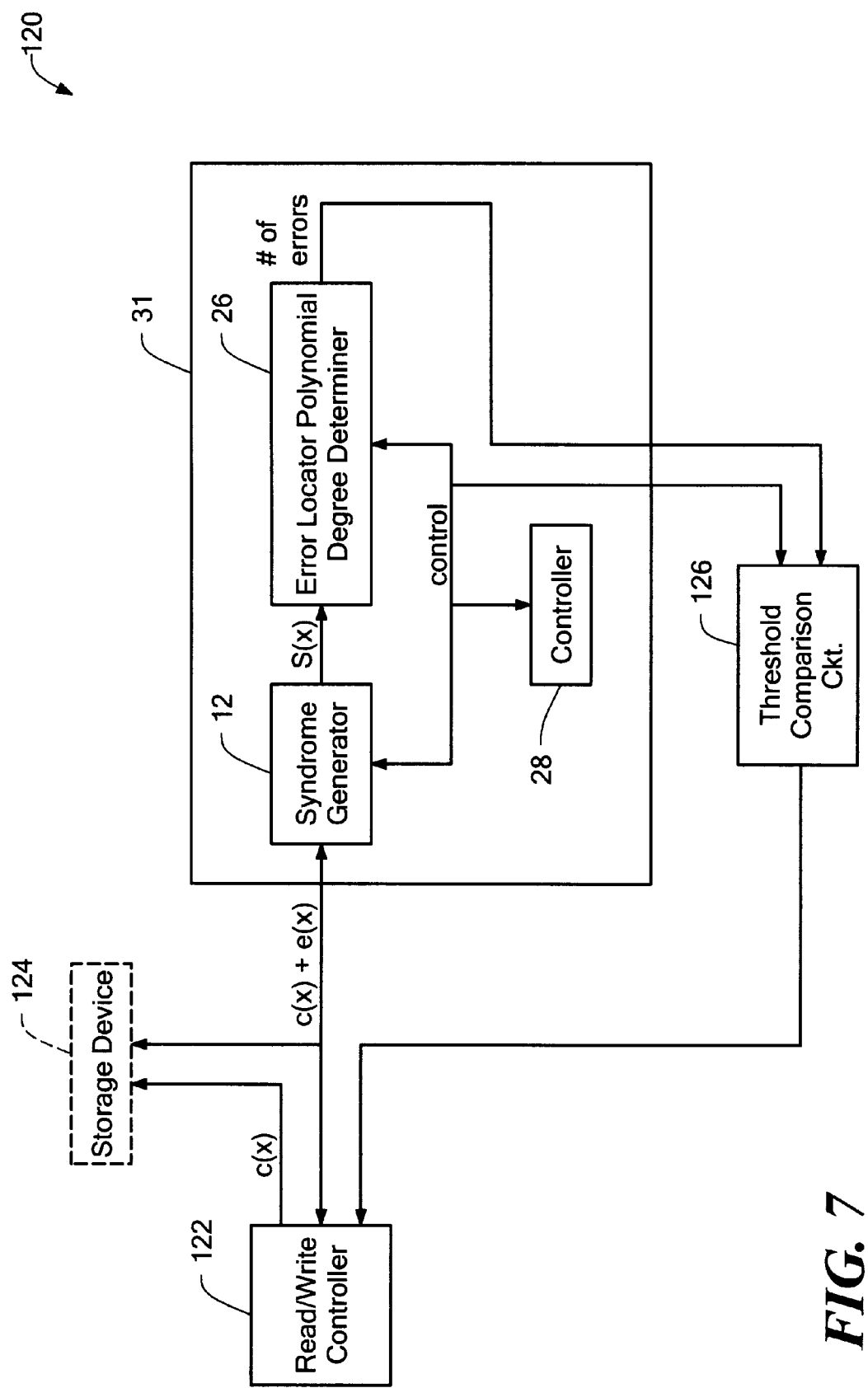
FIG. 7 is a block diagram of a storage device test unit which uses the error locator polynomial determiner of FIGS. 1, 3 and 4.

Referring to FIG. 7, a test unit 120 includes a read/write controller 122 for writing codewords c(x) to and reading codewords c(x)+e(x) from a storage device 124 (shown in dashed lines), such as a disk, under test. Each retrieved codeword is provided to the syndrome generator 12, which is controlled by the controller 28 to send the syndromes S(x) to the error locator polynomial degree determiner 26, which operates to in the manner described above (with reference to FIG. 3 or FIG. 4). The determiner 26 is directed by the controller 28 to provide the error number to a threshold comparison circuit (or unit) 126 to produce a pass/fail determination based on whether the error number exceeds a predetermined error threshold. If the error number is above threshold, the threshold comparison circuit 126 provides a "fail" indication to the read/write controller. The read/write controller then determines, based on the pass/fail determinations for each of the read codewords (and thus their associated storage locations), if the disk as a whole is bad. That is, is determines if a predetermined number of one or more of the read codewords has an above-threshold number of errors. For such a determination, the read/write controller communicates the disk failure to an operator display device (not shown), which indicates to the operator the disk's rejected status.

It will be understood that the overall disk test methodology, such as the number of read storage locations, e.g., sectors, of the read/write controller is a matter of design choice and may be implemented using known techniques. For example, one option may be to test each sector on the disk and determine the disk's failure status based on a predetermined number of one or more failed sectors. Another approach may involve examining a number of one or more sectors per track for pass/fail status and determining the disk's status from a number of one or more bad tracks per disk. For the latter technique, the predetermined error threshold would be set to a lower level for a tighter test limit to compensate for the fewer number of sectors being tested.

Alternatively, with respect to both FIGS. 6 and 7, the determiner 26 could produce a threshold detection outcome (e.g., less than t) in the manner described with reference to FIG. 5.

Other Embodiments

It is to be understood that while the invention has been described in conjunction with the detailed description thereof, the foregoing description is intended to illustrate and not limit the scope of the invention, which is defined by the scope of the appended claims. Other embodiments are within the scope of the following claims.

What is claimed is:

1. A method of determining a number of errors in an error correction codeword comprising:

determining from the error correction codeword a syndrome polynomial associated with an error locator polynomial of a degree and having error locator polynomial coefficients;

operating on the syndrome polynomial to determine the degree without determining the error locator polynomial coefficients; and identifying the degree as the number of errors in the error correction codeword.

2. The method of claim 1, further comprising:

determining if the number of errors exceeds an error threshold.

3. The method of claim 1, wherein the error correction codeword is stored on a storage device in a storage location, further comprising:

rewriting the error correction codeword to a storage location on the storage device if it is determined that the number of errors exceeds the error threshold; and providing an indication based on the determining.

4. The method of claim 1, and wherein operating on the syndrome polynomial comprises:

performing a Euclidean process to determine the degree without determining the coefficients.

5. The method of claim 4, wherein the error correction codeword is a t error correcting codeword and wherein performing the Euclidean process comprises:

initializing a divisor value corresponding to the syndrome polynomial and a dividend value corresponding to a polynomial $x^{2t}$.

6. The method of claim 5, wherein performing the Euclidean process further comprises:

initializing a degree count to zero and a degree count indicator value to zero;

producing a quotient value from a leading term of the dividend value and a leading term of the divisor value;

generating a remainder value from the quotient value;

updating the dividend for the remainder value;

incrementing the degree count by one and setting the degree count indicator value to one if the degree count indicator value is set to zero;

repeating the steps of producing, generating, incrementing and setting until the difference of the degree of divisor value subtracted from the dividend value is less than zero;

setting the degree count indicator value to zero;

interchanging the divisor value and remainder value;

determining if the degree of the remainder value is less than t;

if the degree of the remainder value is less that t, then indicating that the degree count is the number of errors;

if the degree of the remainder value is not less than t, then repeating the steps of producing, generating, incrementing, setting, repeating, interchanging and determining.

7. The method of claim 1, wherein the syndrome polynomial has syndrome values and wherein operating on the syndrome polynomial comprises:

arranging the computed syndrome values to form a matrix having rows of unequal lengths;

examining at least one row for nonzero values; and producing error number information when the examined at least one row has no nonzero values.

8. The method of claim 7, further comprising:

performing row operations on the rows of the matrix.

9. The method of claim 8, wherein the matrix includes a number of rows equal to t and wherein examining comprises examining a last row for nonzero values, and wherein the error number information indicates that the number of errors in the codeword is fewer than t if the examined last row has no nonzero values.

10. The method of claim 9, wherein t is a predetermined threshold value.

11. The method of claim 8, wherein examining is performed prior to each of the row operations.

12. The method of claim 8, wherein examining and performing are repeated until an examined row is equal to all zero values or the row is row t.

13. The method of claim 12, wherein the error number information comprises the number of errors.

14. The method of claim 12, wherein producing comprises:

indicating that the number of the row corresponds to the number of errors if the examined row is equal to all zero values.

15. The method of claim 12, wherein producing comprises:

indicating that the number of errors is at least t if the row is row t.

16. A method of testing a storage medium having a codeword stored thereon, comprising:

reading the codeword from the storage medium;

generating syndrome values for the codeword;

obtaining from the syndrome values a degree of an error locator polynomial without computing the coefficients of the error locator polynomial, the degree corresponding to the number of errors;

comparing the number of errors to an error threshold; and determining if the number of errors exceeds the error threshold.

17. A method of testing a storage medium having codewords stored thereon, comprising:

reading the codewords from the storage medium;

generating syndrome values for the codewords;

obtaining from the syndrome values a degree of an error locator polynomial without computing the coefficients of the error locator polynomial, the degree corresponding to the number of errors;

comparing the number of errors to an error threshold; and determining, for each of the codewords, if the number of errors exceeds the error threshold.

18. The method of claim 17, further comprising:

if the number of errors is determined to exceed the error threshold for a predetermined number of one or more codewords, then rejecting the storage medium as a failure.

19. A decoder for processing a codeword read from a storage medium comprising:

a syndrome generator for producing a syndrome polynomial from the codeword, the syndrome polynomial being associated with an error locator polynomial have a degree and coefficients; and an error locator polynomial degree determiner coupled to the syndrome generator for determining from the syndrome polynomial the degree of the error locator polynomial without ion determining the coefficients of the error locator polynomial, and indicating the degree as the number of errors in the codeword.

20. A data storage system comprising:

a storage device having a codeword stored in a location thereon;

a read/write controller coupled to the storage device for reading the codeword from the storage device;

a decoder for generating from the codeword a syndrome polynomial, the syndrome polynomial being associated with an error locator polynomial of a degree and coefficients, and for determining from the syndrome polynomial the degree of the error locator polynomial without determining the coefficients of the error locator polynomial, and for indicating the degree as the number of errors in the codeword to the read/write controller.

21. The data storage system of claim 20, wherein the read/write controller is adapted to store the codeword in another location if the number of errors indicated by the decoder exceeds an error threshold.

22. A test apparatus for testing a storage medium having codewords stored thereon comprising:

a read/write controller coupled to storage medium and the error count unit for reading codewords from the storage medium;

an error count unit for generating from each of the codewords a syndrome polynomial, the syndrome polynomial being associated with an error locator polynomial of a degree and coefficients, for determining from the syndrome polynomial the degree of the error locator polynomial without determining the coefficients of the error locator polynomial, and for indicating the degree as the number of errors in to the read/write controller; and a unit for comparing the number of errors to an error threshold to determine if the number of errors exceeds the error threshold.

23. The test apparatus of claim 22, wherein the unit indicates that the storage medium is rejected if the number of errors is determined to exceed the error threshold for a predetermined number of one or more of the codewords.

* * * * *